United States Patent
Santiago et al.

(10) Patent No.: US 12,227,847 B2
(45) Date of Patent: Feb. 18, 2025

(54) LEVEL MONITORING AND ACTIVE ADJUSTMENT OF A SUBSTRATE SUPPORT ASSEMBLY

(71) Applicant: Applied Materials, Inc., Santa Clara, CA (US)

(72) Inventors: James V. Santiago, Santa Clara, CA (US); Patricia M. Liu, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 416 days.

(21) Appl. No.: 17/218,882

(22) Filed: Mar. 31, 2021

(65) Prior Publication Data
US 2022/0316066 A1     Oct. 6, 2022

(51) Int. Cl.
*C23C 16/52*     (2006.01)
*C23C 16/458*     (2006.01)
(Continued)

(52) U.S. Cl.
CPC .......... *C23C 16/52* (2013.01); *C23C 16/4584* (2013.01); *H01L 21/67011* (2013.01);
(Continued)

(58) Field of Classification Search
CPC .......... H01L 21/6011; H01L 21/67259; H01L 21/68; H01L 21/68742; H01L 21/6864;
(Continued)

(56) References Cited

U.S. PATENT DOCUMENTS 5,853,607 A    12/1998   Zhao et al.
8,585,823 B2 *   11/2013   Um .......................... C23C 16/46
                                                          118/728
(Continued)

FOREIGN PATENT DOCUMENTS

KR    10-2011-0054994 A    5/2011
KR    20190097447 A    8/2019
(Continued)

OTHER PUBLICATIONS

International Search Report Dated Jul. 6, 2022 for application No. PCT/US2022/021034.
(Continued)

*Primary Examiner* — Charlee J. C. Bennett
(74) *Attorney, Agent, or Firm* — Patterson + Sheridan, LLP

(57) ABSTRACT

Embodiments of the present disclosure generally relate to an apparatus and method of processing a substrate. In at least one embodiment, an apparatus includes a chamber body, a substrate support assembly and a bracket assembly disposed outside the chamber body and coupled to the substrate support assembly. The bracket assembly has a plurality of leveling screws for adjusting a level of the substrate support assembly. The apparatus includes an actuator coupled to one of the plurality of leveling screws and an accelerometer coupled to the substrate support assembly. The accelerometer is configured to indicate an orientation of the substrate support assembly. The apparatus includes a control module in communication with the actuator and the accelerometer. The control module is configured to determine the level of the substrate support assembly based on the orientation indicated by the accelerometer and adjust the level of the substrate support assembly using the actuator.

13 Claims, 6 Drawing Sheets

(51) Int. Cl.
*H01L 21/67* (2006.01)
*H01L 21/68* (2006.01)
*H01L 21/687* (2006.01)

(52) U.S. Cl.
CPC ........ *H01L 21/67259* (2013.01); *H01L 21/68* (2013.01); *H01L 21/68742* (2013.01); *H01L 21/68764* (2013.01); *H01L 21/68785* (2013.01)

(58) Field of Classification Search
CPC H01L 21/68785; C23C 16/52; C23C 16/4584
USPC .......................................... 118/728
See application file for complete search history.

(56) References Cited

U.S. PATENT DOCUMENTS

| | | | | |
|---|---|---|---|---|
| 2005/0288119 A1* | 12/2005 | Wang | ................ | A63B 69/36 473/223 |
| 2007/0252969 A1* | 11/2007 | Ueno | ................ | G03F 7/70725 355/72 |
| 2013/0133425 A1* | 5/2013 | Lin | ................ | G01P 15/008 73/514.09 |
| 2013/0330154 A1* | 12/2013 | Sowden | ............ | H01L 21/67288 414/222.02 |
| 2014/0225335 A1* | 8/2014 | Kurashima | ....... | H01L 21/68792 279/3 |
| 2015/0228462 A1* | 8/2015 | Yoshimura | ........ | H01J 37/32834 156/345.51 |
| 2016/0033882 A1* | 2/2016 | Deepak | ............... | G03F 7/70716 355/72 |
| 2018/0073143 A1* | 3/2018 | Masuda | ............ | H01J 37/32091 |
| 2019/0043744 A1* | 2/2019 | Cho | .................. | H01L 21/68735 |
| 2019/0229004 A1 | 7/2019 | Schaller et al. | | |
| 2020/0105573 A1* | 4/2020 | Schaller | ............ | H01L 21/68764 |
| 2022/0363487 A1* | 11/2022 | Nakamura | ........ | H01L 21/67259 |

FOREIGN PATENT DOCUMENTS

| | | |
|---|---|---|
| KR | 10-2033906 | 11/2019 |
| KR | 10-2020-0021293 A | 2/2020 |
| WO | 2012-040705 A2 | 3/2012 |

OTHER PUBLICATIONS

KR Office Action with Translation DTD Oct. 13, 2024 For KR 10-2023-7013022.

* cited by examiner

LEVEL MONITORING AND ACTIVE ADJUSTMENT OF A SUBSTRATE SUPPORT ASSEMBLY

BACKGROUND

Field

Embodiments of the present disclosure generally relate to an apparatus and method of processing a substrate within a semiconductor processing chamber having a substrate support assembly. More particularly, embodiments relate to level monitoring and active adjustment of the substrate support assembly during processing.

Description of the Related Art

Semiconductor processing systems are used to form semiconductor devices by depositing, etching, patterning and treating thin films and coatings. A conventional semiconductor processing system contains one or more processing chambers and robots for moving a substrate therebetween. A substrate may be transferred by a robotic arm which can extend to pick up the substrate, retract and then extend again to position the substrate in a different position within the same or a different processing chamber. Each processing chamber typically has a support for supporting the substrate for processing.

Most semiconductor device formation processes are improved when the uniformity of the processes performed on the substrate surface is improved. One of the parameters which may affect uniformity of a deposition, etching or thermal treatment process is the position of the substrate relative to one or more of the chamber components found in the processing chamber, such as a gas distribution plate, during processing. However, conventional approaches to adjusting substrate position are time consuming and reduce throughput.

Therefore, there is a need in the art for an apparatus and method providing for adjusting substrate position in a processing chamber.

SUMMARY

Embodiments of the present disclosure generally relate to an apparatus and method of processing a substrate within a semiconductor processing chamber having a substrate support assembly. More particularly, embodiments relate to level monitoring and active adjustment of the substrate support assembly during processing.

In at least one embodiment, a substrate processing apparatus includes a chamber body and a substrate support assembly including a stem and a support body. The support body is positioned within the chamber body and coupled to the stem. The apparatus includes a bracket assembly disposed outside the chamber body and coupled to the stem. The bracket assembly has a plurality of leveling screws for adjusting a level of the substrate support assembly. The apparatus includes an actuator coupled to one of the plurality of leveling screws and an accelerometer coupled to the substrate support assembly. The accelerometer is configured to indicate an orientation of the substrate support assembly. The apparatus includes a control module in communication with the actuator and the accelerometer. The control module is configured to determine the level of the substrate support assembly based on the orientation indicated by the accelerometer and adjust the level of the substrate support assembly using the actuator.

In at least one embodiment, a computer readable medium stores instructions, that, when executed by a processor of a system, cause the system to: receive a signal from an accelerometer coupled to a substrate support assembly, wherein: the substrate support assembly comprises a stem and a support body, the support body positioned within a chamber body and coupled to the stem, the stem coupled to a bracket assembly disposed outside the chamber body, and the signal corresponds to a three-dimensional orientation of the substrate support assembly; determine an adjustment of the substrate support assembly based on the signal to change an actual level of the substrate support assembly to a target level; and adjust the actual level of the substrate support assembly to the target level using an actuator configured to actuate one or more of a plurality of leveling screws of the bracket assembly, wherein the processor is in communication with the actuator and the accelerometer.

In at least one embodiment, a substrate processing method is disclosed for processing a substrate disposed on a substrate support assembly comprising a stem and a support body, the support body positioned within a chamber body and coupled to the stem, the stem coupled to a bracket assembly disposed outside the chamber body. The method includes receiving a signal from an accelerometer coupled to the substrate support assembly, wherein the signal corresponds to a three-dimensional orientation of the substrate support assembly; determining an adjustment of the substrate support assembly to change an actual level of the substrate support assembly to a target level; and adjusting the actual level of the substrate support assembly to the target level by turning, using an actuator, one or more of a plurality of leveling screws of the bracket assembly, wherein receiving the signal, determining the adjustment, and adjusting the actual level are implemented via a control module in communication with the actuator and the accelerometer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an apparatus and method of processing a substrate within a semiconductor processing chamber having a substrate support assembly. More particularly, embodiments relate to level monitoring and active adjustment of the substrate support assembly during processing.

Apparatus and methods of the present disclosure provide improved control of film thickness and etch uniformity both across a substrate and substrate-to-substrate. In addition, apparatus and/or methods disclosed herein can better accommodate substrate non-uniformity on incoming substrates. Furthermore, apparatus and methods disclosed herein can reduce process downtime and improve yield.

Supports disclosed herein are capable of being adjusted during processing, in contrast to conventional approaches which instead require taking the chamber offline. Conventionally, a tilt and position of the pedestal relative to the one or more of the chamber components, such as the gas distribution plate is not adjusted once the processing chamber is in production. As used herein, the level of the pedestal refers to the tilt of the pedestal measured as a degree of parallelism between a substrate-receiving surface of the pedestal in relation to the gas distribution plate. Currently the pedestal tilt and position is manually adjusted while the chamber is offline. To make accurate adjustments, the processing chamber is taken offline and opened so that a leveling jig can be placed inside the processing chamber for measuring the tilt of the pedestal relative to the gas distribution plate. The pedestal may be adjusted without taking the processing chamber offline, referred to as blind adjustment or hot leveling. However, blind adjustment is based only on measurements performed on the processed substrate and does not provide a quantitative measurement of the change in tilt or the resulting level. However, there are certain processing operations in the production sequence of a semiconductor device that do not result in high uniformity of material across the substrate, necessitating adjustment between processing operations to improve uniformity of a subsequent operation. To assure optimal process results, each process may utilize an independently tuned pedestal tilt and position relative to the gas distribution plate, which decreases throughput.

Aspects of the present disclosure are discussed with reference to a "substrate" or semiconductor substrate for purposes of illustration and discussion. Those of ordinary skill in the art, using the disclosures provided herein, will understand that the example aspects of the present disclosure can be used in association with any suitable semiconductor substrate or other suitable substrate. A "substrate support assembly" refers to any structure that can be used to support a substrate.

Figure 1A:
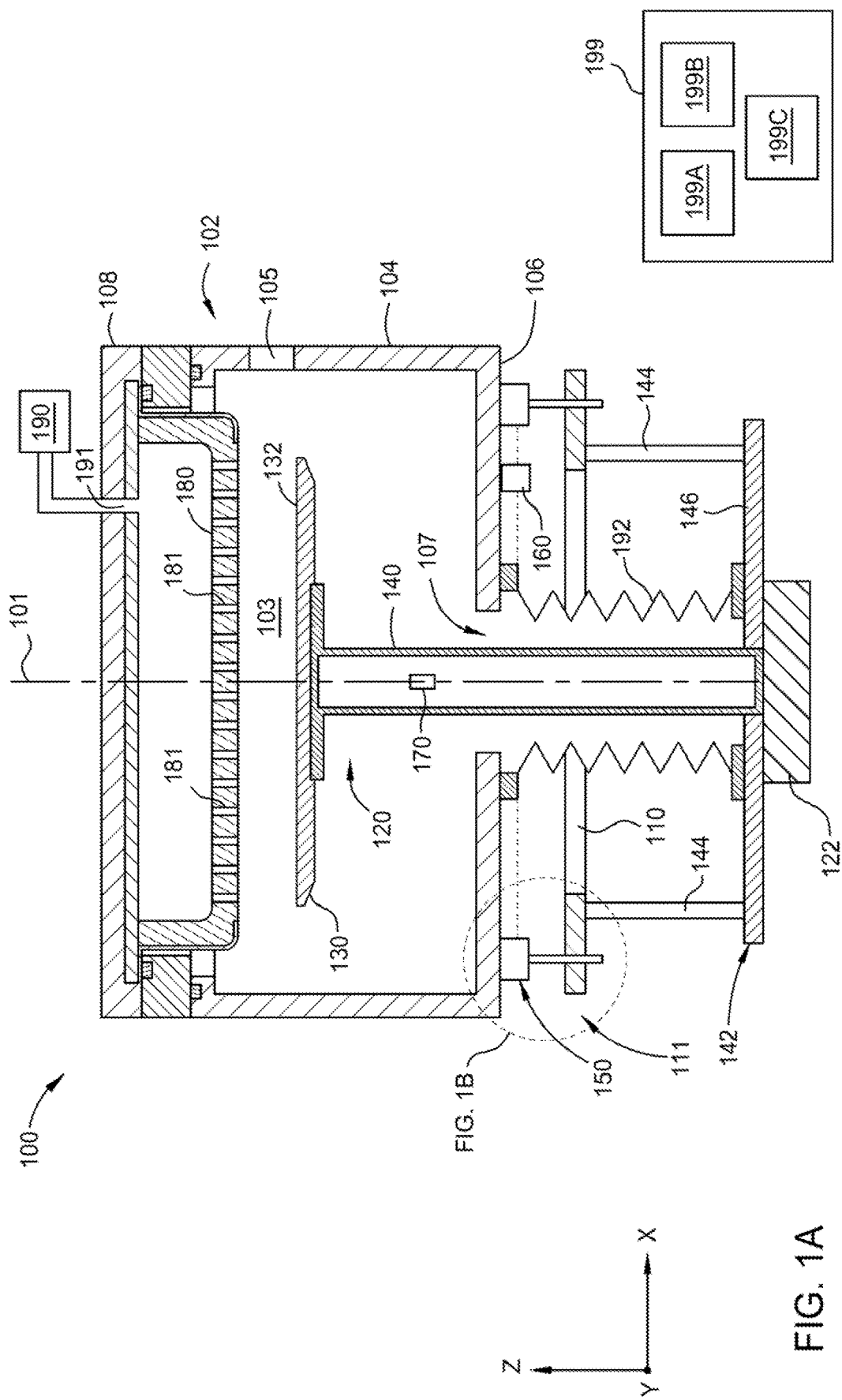
FIG. 1A is a side cross sectional view of a substrate processing apparatus, according to at least one embodiment.

With reference now to the figures, example embodiments of the present disclosure will now be set forth. FIG. 1A depicts an exemplary processing apparatus 100 that may be used to perform some part of a semiconductor device processing operation, according to an embodiment of the disclosure provided herein. Referring to FIG. 1A, the processing apparatus 100 may include a processing chamber 102 having a substrate support assembly 120 for lifting and positioning a substrate within the processing chamber 102. The substrate support assembly 120 generally includes a support body 130 for receiving a substrate and a stem 140 for positioning the support body 130 within the processing chamber 102. The disclosed substrate support assembly 120 is configured to provide heating or cooling to a substrate during processing. The substrate may be held by a mechanical, pressure differential or electrostatic force to the support body 130 during processing. When on the support body 130, one or more processes may be performed on the substrate, which may include depositing, etching and/or thermally treating a film formed thereon. The substrate support assembly 120 is described in more detail below.

The processing chamber 102 is configured to enclose a substrate within a controlled environment during processing. The processing chamber 102 includes an outer chamber wall 104, a lower chamber base 106 and a cover 108, which is disposed at the top of the processing chamber 102 and opposite to the base 106. The base 106, cover 108, and wall 104 are also collectively referred to herein as a chamber body. The processing chamber 102 includes a gas distribution plate 180 suspended from the cover 108 and projecting downward from the cover 108 into the processing chamber 102. A slit valve opening 105 in the wall 104 permits the introduction of an object such as a substrate or wafer (not shown) into the processing chamber 102.

A substrate may be positioned inside the processing chamber 102 and disposed on the support body 130 in preparation for processing. A gas supply source 190 provides a process gas or gases through opening 191 within the cover 108 and through openings 181 of the gas distribution plate 180 to a process region 103. In one example, the processing chamber 102 represents a chemical vapor deposition (CVD) chamber. However, other processing chambers and processes are contemplated such as etch processes, atomic layer deposition processes, rapid thermal processes, plasma doping processes, physical vapor deposition processes, and others which utilize movement of a pedestal within a processing chamber.

The substrate support assembly 120 is disposed inside the processing chamber 102 and configured to control an orientation of a substrate in relation to one or more of the chamber components found in the processing chamber 102, such as the gas distribution plate 180. The substrate support assembly 120 is coupled to a hub 122 which is accessible from outside the processing chamber 102 during processing and/or when the processing chamber 102 is closed. The process region 103 inside the processing chamber 102 is sealed from the region outside the processing chamber 102 by a flexible sealing member 192, such as a bellows assembly. The sealing member 192 provides a seal between the substrate support assembly 120 and the processing chamber 102 and allows the process region 103 to be maintained at a desired pressure, such as vacuum pressure.

The stem 140 of the substrate support assembly 120 extends from a proximal end attached to the hub 122 to a distal end attached to a lower surface of the support body 130. An upper surface 132 of the support body 130 faces opposite the lower surface and is configured to receive a substrate thereon. Therefore, the upper surface 132 of the support body 130 may be referred to herein as a substrate-receiving surface. The support body 130 is generally adapted to be moved vertically in a direction that is parallel to a center axis 101 (e.g., parallel with an axis of the stem 140), which extends through a chamber opening 107 in the base 106.

It may be desirable to heat or cool the substrate support assembly 120 to control temperature of a substrate received on the support body 130. In one example, the substrate support assembly 120 includes one or more electrical heating elements (not shown) for heating the support body 130 and the substrate. In another example, the substrate support assembly 120 includes tubing (not shown) for carrying a heating or cooling fluid to heat or cool, respectively, the support body 130 and the substrate. It may also be desirable to monitor one or more parameters associated with the substrate support assembly 120. In one example, the substrate support assembly 120 includes a thermocouple (not shown) for sensing a temperature of the support body 130. In such examples, electrical leads and/or tubing may be routed through the hub 122 and stem 140 of the substrate support assembly 120 to the support body 130. Therefore, the stem 140 includes one or more internal channels (not shown) which exit the proximal end of the stem 140 through respective ports formed therein. From there, the electrical leads are fed through the hub 122 and coupled to a control module 160 for energizing the electrical heating elements and/or receiving signals from the thermocouple. Likewise, the tubing is fluidly coupled to a source of heating or cooling fluid.

A frame 142 is used to couple the substrate support assembly 120 to a bracket assembly 111 disposed outside the chamber body. The frame 142, as shown in FIG. 1A, comprises one or more vertical legs 144 coupled to the bracket assembly 111 and one or more horizontal legs 146 coupled to the stem 140 of the substrate support assembly 120. The one or more horizontal legs 146 attach to the stem 140 at a location between the hub 122 and sealing member 192. However, in another embodiment, the frame 142 may be attached to the hub 122 or at a different location on the stem 140. It is contemplated that the frame 142 may be welded, bolted or otherwise fastened to the bracket assembly 111 and the stem 140. Being fixed together, the bracket assembly 111, frame 142 and substrate support assembly 120 are movable in relation to the processing chamber 102 as described in more detail below.

Figure 1B:
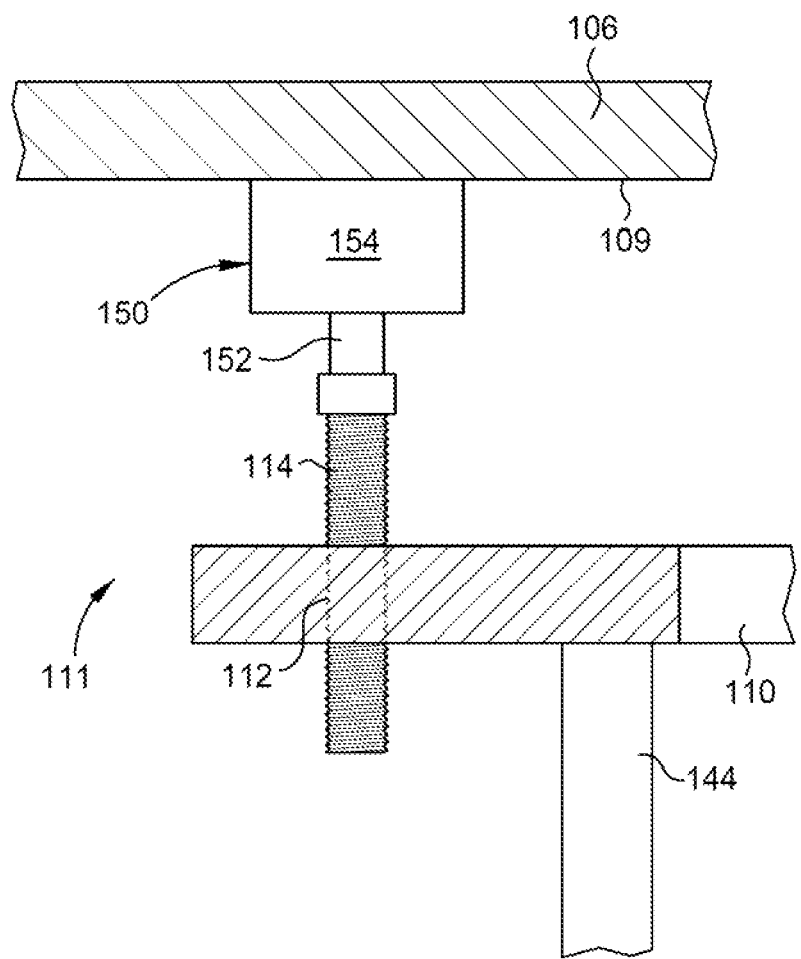
FIG. 1B is an enlarged partial cross sectional view of the substrate processing apparatus of FIG. 1A.

FIG. 1B is an enlarged partial cross sectional view of the substrate processing apparatus of FIG. 1A which illustrates the bracket assembly 111 in more detail. FIG. 1A and FIG. 1B are, therefore, described together herein for clarity. The bracket assembly 111 includes a bracket 110 with a plurality of leveling holes 112 formed therethrough. Although only two leveling holes are shown in FIG. 1A, it is contemplated that the bracket 110 may include additional leveling holes, such as three or more leveling holes. It is contemplated that a shape of the bracket 110 when viewed from above may be a triangle, square, rectangle, or trapezoid, among other shapes. It is contemplated that one leveling hole 112 may be formed at each vertex of the bracket 110. Each of the plurality of leveling holes 112 extends parallel to one another from a bottom side of the bracket 110, accessible from below the bracket 110, to a top side of the bracket 110, which faces the base 106 of the processing chamber 102. Each of the plurality of leveling holes 112 is threaded for receiving a respective threaded leveling screw 114 therethrough.

A proximal end of each leveling screw 114 is coupled to a shaft 152 of a respective actuator 150, such as a stepper motor, for turning the leveling screw 114. A body 154 of the actuator 150 is coupled to a lower face 109 of the base 106 for bracing the body 154 against rotation of the shaft 152. When using a stepper motor, the shaft 152 of the stepper motor is configured to rotate by a fixed angle between a plurality of incremental rotational positions allowing the leveling screw 114 to be turned by an incremental amount for precisely raising and lowering the height of the bracket 110. The height of the bracket 110 is maintained until the actuator 150 is further adjusted. The rotational position of the stepper motor is stored in memory of the control module 160, which enables fine-tuning of the position of the leveling screw 114.

In operation, rotation of each leveling screw 114 relative to a respective leveling hole 112 causes the bracket 110 to move longitudinally with respect to the leveling screw 114. This longitudinal movement pushes or pulls the bracket 110 away from or towards the base 106 which causes a relative change in distance between the bracket 110 and the base 106. This change in distance between the bracket 110 and base 106 adjusts the orientation (e.g., tilt) of the substrate support assembly 120 relative to the center axis 101. Tilting of the substrate support assembly 120 causes the substrate-receiving surface 132 of the support body 130 to tilt in relation to the gas distribution plate 180. Adjusting multiple leveling screws 114 changes the tilt and the resulting level of the substrate support assembly 120 in three dimensions. It is contemplated that a maximum tilt of the substrate support assembly 120 may be about 0.5 inches or less, such as about 0.4 inches or less, such as about 0.3 inches or less, such as about 0.2 inches or less, such as about 0.1 inches or less, such as about 0.1 inches to about 0.4 inches, such as about 0.1 inches to about 0.2 inches, such as about 0.1 inches.

The plurality of actuators 150 receive instructions from the control module 160. Referring to FIG. 1A, the control module 160 is disposed on the lower face 109 of the base 106. However, it is contemplated that the control module 160 may be located elsewhere on the processing apparatus 100, referred to as on-board positioning. For example, it is contemplated that the control module 160 may be disposed on the bracket assembly 111 or coupled to the hub 122. It is also contemplated that the control module 160 may be located separate from the processing apparatus 100, referred to as an off-board positioning. The control module 160 is a dedicated controller for sending instructions to the plurality of actuators 150 to control tilting of the substrate support assembly 120 as described in more detail below. The control module 160 may include the same components as the system controller 199 (described in detail below). Thus, it is also contemplated that the control module 160 may be integrated with the system controller 199.

The system controller 199 is configured to control one or more aspects of the processing apparatus 100. The system controller 199 may include a central processing unit (CPU) 199A, memory 199B, and support circuits (or I/O) 199C. The CPU 199A may be one of any form of computer processors that are used in industrial settings for controlling various processes and hardware (e.g., pattern generators, motors, and other hardware) and monitor the processes (e.g., processing time and substrate position or location). The memory 199B is connected to the CPU, and may be one or more of a readily available memory, such as random access memory (RAM), read only memory (ROM), floppy disk, hard disk, or any other form of digital storage, local or remote. Software instructions, algorithms and data can be coded and stored within the memory for instructing the CPU. The support circuits 199C are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position or location.

Referring to FIG. 1A, an accelerometer 170 is disposed inside the stem 140 of the substrate support assembly 120. Positioning the accelerometer inside the stem 140 protects the accelerometer 170 from potentially damaging chemicals that may be present during substrate processing. It is contemplated that the accelerometer 170 may be inserted through a hole (not shown) in the proximal end of the stem 140. This enables servicing and replacement of the accelerometer 170 without exposing the process region 103 to atmosphere. However, it is contemplated that the accelerometer 170 may be coupled to or embedded within any portion of the substrate support assembly 120, such as the support body 130. It is contemplated that the accelerometer 170 may have a coating which protects the accelerometer 170 from corrosion and/or electrical malfunction when exposed to potentially damaging processing chemicals. The accelerometer 170, as shown in FIG. 1A, is wirelessly connected to the control module 160. However, in another embodiment, the accelerometer 170 may be hardwired to the control module 160. The accelerometer 170 is in communication with the control module 160 and configured to send signals to the control module 160 which are indicative of the three-dimensional orientation of the accelerometer 170 and the corresponding tilt of the substrate support assembly 120. For example, the accelerometer may be a capacitive three-axis accelerometer which outputs a voltage corresponding to an orientation of the accelerometer along each of the three axes. Before bringing the processing apparatus 100 online, the accelerometer 170 is calibrated using a leveling jig so that the orientation/tilt of the accelerometer 170 and substrate support assembly 120 are known with respect to the level of the support body 130. Thus, the control module 160 is operable to monitor the level of the support body 130 in real-time by detecting changes in the tilt of the substrate support assembly 120 as the plurality of leveling screws 114 are adjusted as described in more detail below.

FIGS. 1C-1F are schematic partial isometric views of the substrate processing apparatus 100 of FIG. 1A illustrating tilting of the substrate support assembly 120 in three dimensions. In FIGS. 1C-1F, the bracket 110 is in the shape of a triangle when viewed from above. In general, the bracket assembly 111 includes a first leveling screw 114a and a second leveling screw 114b which are adjustable, and a set screw 124, which is fixed. The first and second leveling screws 114a, 114b are rotatable by actuators 150a, 150b whereas the set screw 124 is adjusted manually using nuts 126. Although the bracket assembly 111 has two leveling screws and one fixed screw, the present disclosure contemplates other numbers and combinations of leveling and fixed screws. For example, it is contemplated that when the bracket 110 is in the shape of a trapezoid, the bracket assembly 111 may include two leveling screws, one fixed screw and one floating screw. The term "floating screw" refers to a structure which is similar to the fixed screw 124 except clearance is provided between each of the nuts 126 and the bracket 110 to enable the bracket to float with respect to the floating screw. It is also contemplated that while the bracket assembly 111 may have any number of leveling, fixed and floating screws, only two leveling screws may be needed to tilt the substrate support assembly 120 in three dimensions.

Figure 1C:
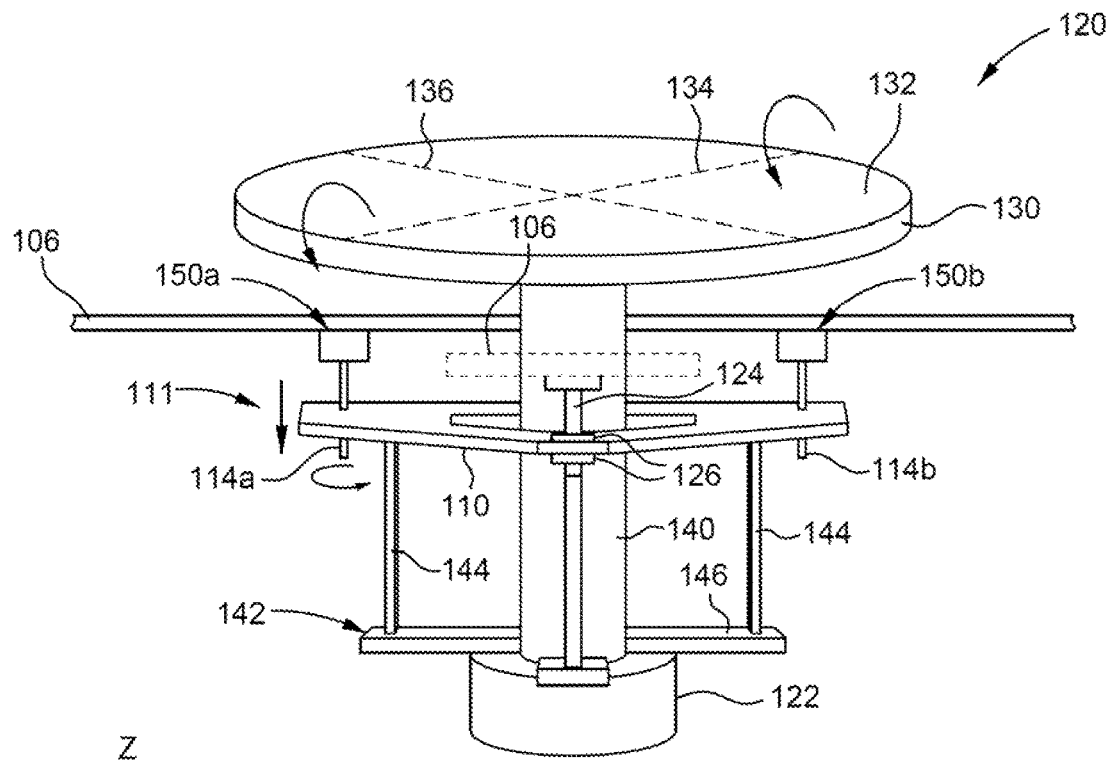
FIGS. 1C-1F are schematic partial isometric views of the substrate processing apparatus of FIG. 1A illustrating tilting of an exemplary substrate support assembly in three dimensions, according to at least one embodiment.
Figure 1D:
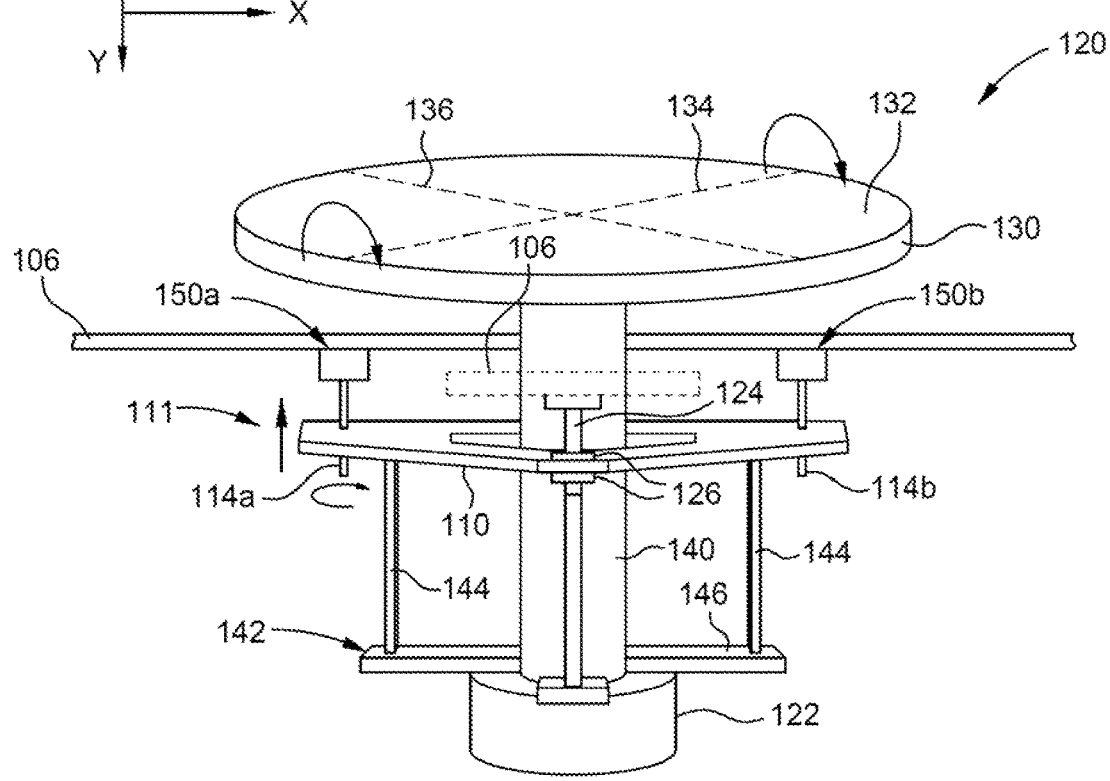

Referring to FIG. 1C, the substrate support assembly 120 is tilted counterclockwise about a first axis 134 by rotating the first leveling screw 114a in a counterclockwise direction as shown. The first leveling screw 114a is rotated by a first actuator 150a. During rotation of the first leveling screw 114a, the bracket 110 moves longitudinally downwards with respect to the first leveling screw 114a, which pushes the bracket 110 away from the base 106 as described in detail above. As the bracket 110 is pushed downwards and away from the base 106, the substrate support assembly 120 is caused to tilt in the direction shown in FIG. 1C. The tilt point is aligned with the vertex of the bracket 110 where the first leveling screw 114a engages a respective leveling hole 112 (shown in FIG. 1B). Rotating the first leveling screw 114a in the opposite direction (i.e., clockwise) pulls the bracket 110 towards the base 106 and causes the substrate support assembly 120 to tilt in the opposite direction (i.e., clockwise) about the first axis 134 as shown in FIG. 1D.

Figure 1E:
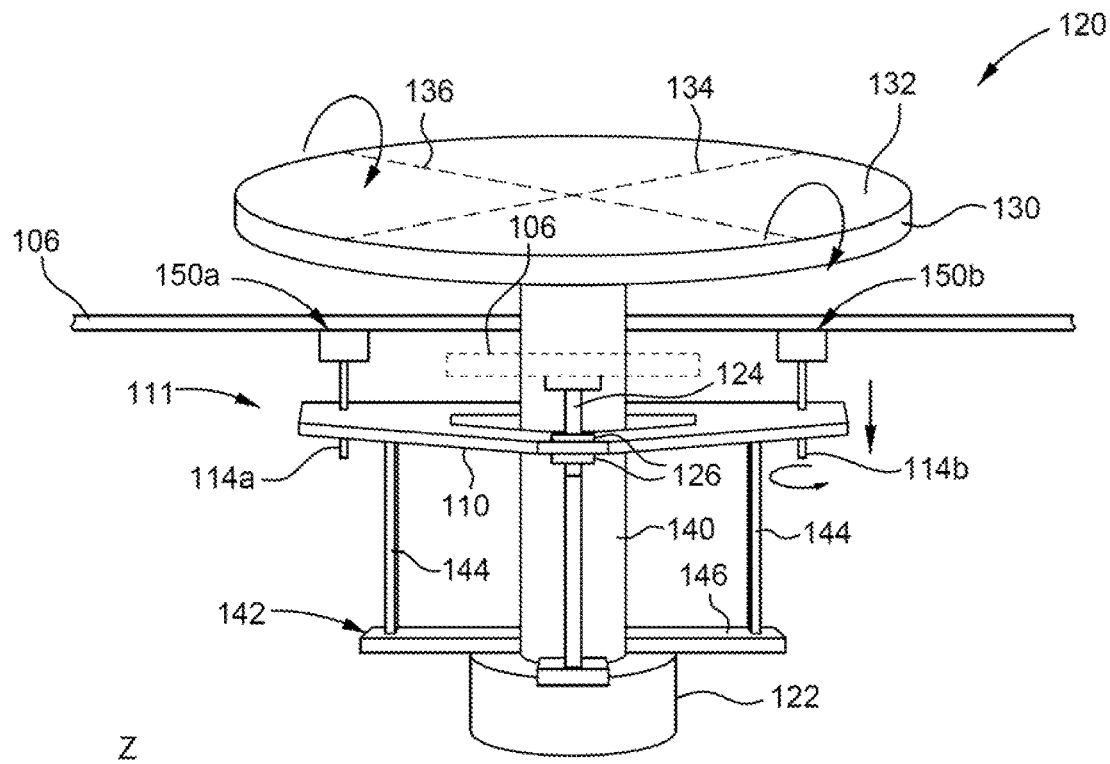
Figure 1F:
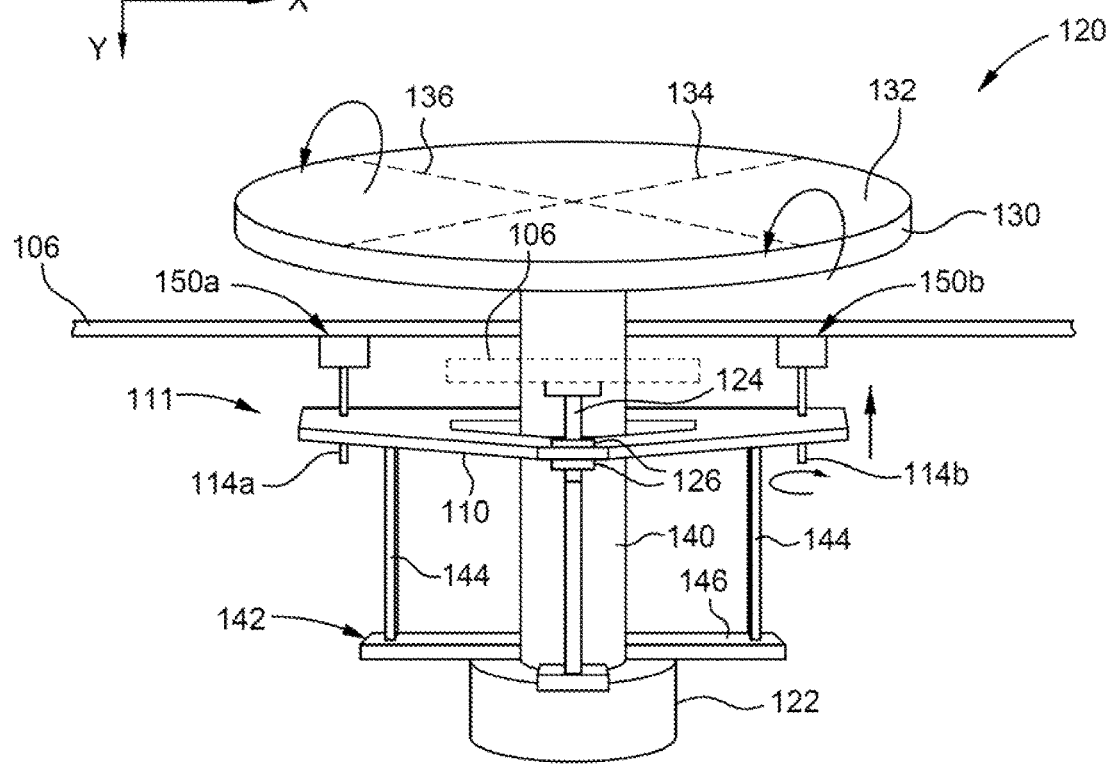

Referring to FIG. 1E, the substrate support assembly 120 is tilted clockwise about a second axis 136 by rotating a second leveling screw 114b in a counterclockwise direction as shown. It is contemplated that the second axis 136 may be oriented at any suitable angle in relation to the first axis 134 based on the shape of the bracket 110. For example, it is contemplated that when the bracket 110 is in the shape of an equilateral triangle, the first and second axes 134, 136 may be oriented about 60 degrees apart. The second leveling screw 114b is rotated by a second actuator 150b. During rotation of the second leveling screw 114b, the bracket 110 moves longitudinally downwards with respect to the second leveling screw 114b, which pushes the bracket 110 away from the base 106 as described in detail above. As the bracket 110 is pushed downwards and away from the base 106, the substrate support assembly 120 is caused to tilt in the direction shown in FIG. 1E. The tilt point is aligned with the vertex of the bracket 110 where the second leveling screw 114b engages a respective leveling hole 112 (shown in FIG. 1B). Rotating the second leveling screw 114b in the opposite direction (i.e., clockwise) pulls the bracket 110 towards the base 106 and causes the substrate support assembly 120 to tilt in the opposite direction (i.e., clockwise) about the second axis 136 as shown in FIG. 1F. If desired, adjusting both the first and second leveling screws 114a, 114b changes the level of the substrate support assembly 120 in three dimensions.

Figure 2:
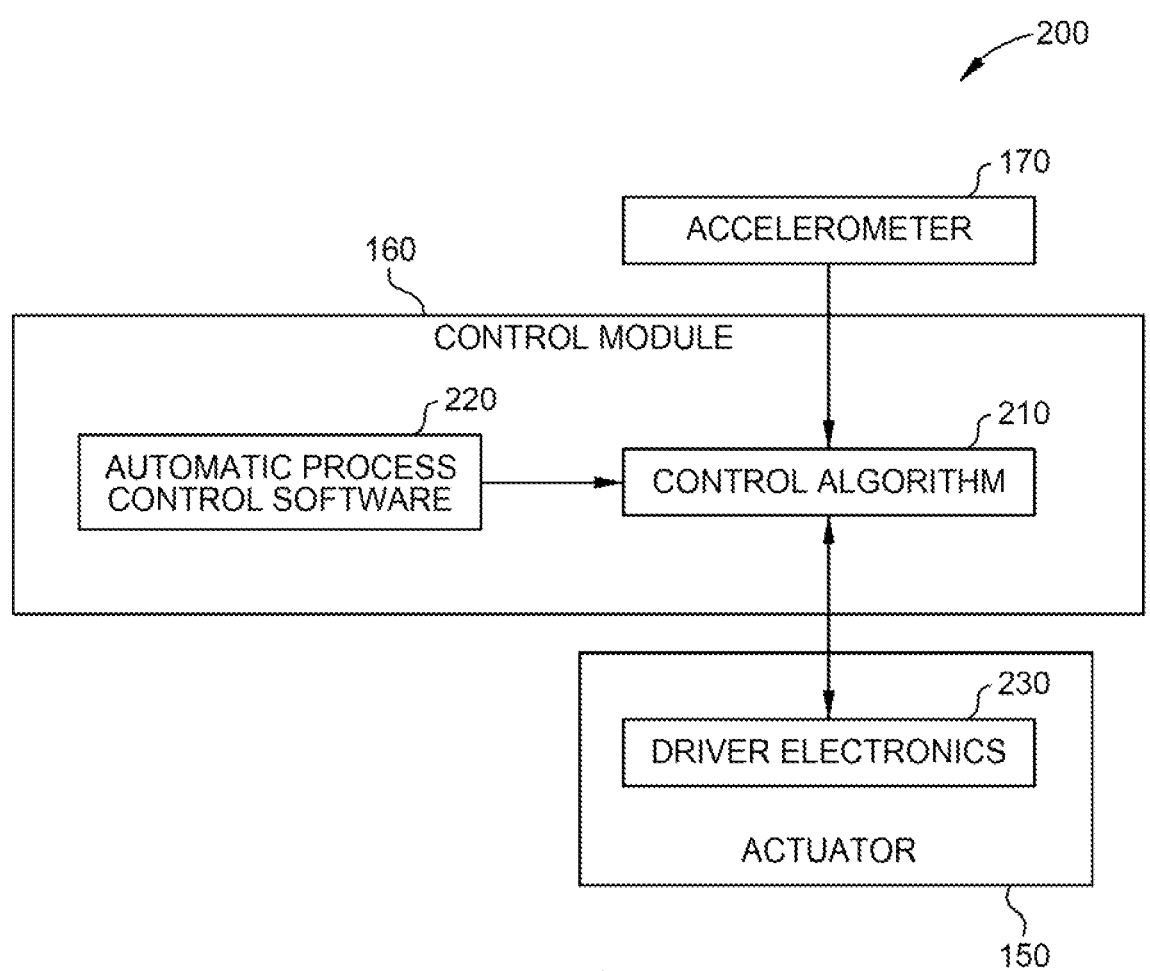
FIG. 2 is a diagram of an exemplary automated control mechanism, according to at least one embodiment

FIG. 2 is a diagram of an exemplary automated control mechanism 200 which may be used to control the substrate support assembly 120. In the example illustrated in FIG. 2, the control module 160 includes a control algorithm 210 which receives inputs from the accelerometer 170, automatic process control software 220, and driver electronics 230 associated with the plurality of actuators 150. The accelerometer 170 provides signals to the control algorithm 210 which are indicative of the three-dimensional orientation of the accelerometer 170 as described above. For example, the signals may include continuous analog or digital voltage readings corresponding to an orientation of the accelerometer 170 along each of the three axes. The automatic process control software 220 provides automated control instructions to the control algorithm 210. For example, the automated control instructions may include instructions to execute the control algorithm 210 without external input from a user. Based on the signals received from the accelerometer 170 and/or the automated control instructions received from the automatic process control software 220, the control algorithm 210 determines an adjustment to one or more of the plurality of actuators 150 which is needed to move the substrate support assembly 120 to a target level. The control algorithm 210 outputs the instructions to the driver electronics 230 to actuate the one or more of the plurality of actuators 150 to move the substrate support assembly 120. During actuation, the driver electronics 230 provides feedback regarding the rotational position of each actuator 150 to the control algorithm 210. The control algorithm 210 determines when the adjustment to the one or more of the plurality of actuators 150 is completed based on the feedback and/or other inputs. It is contemplated that the control algorithm 210 may output further instructions to the one or more of the plurality of actuators 150 using a control loop to fine-tune the position of each leveling screw 114 and the resulting level of the substrate support assembly 120.

Figure 3:
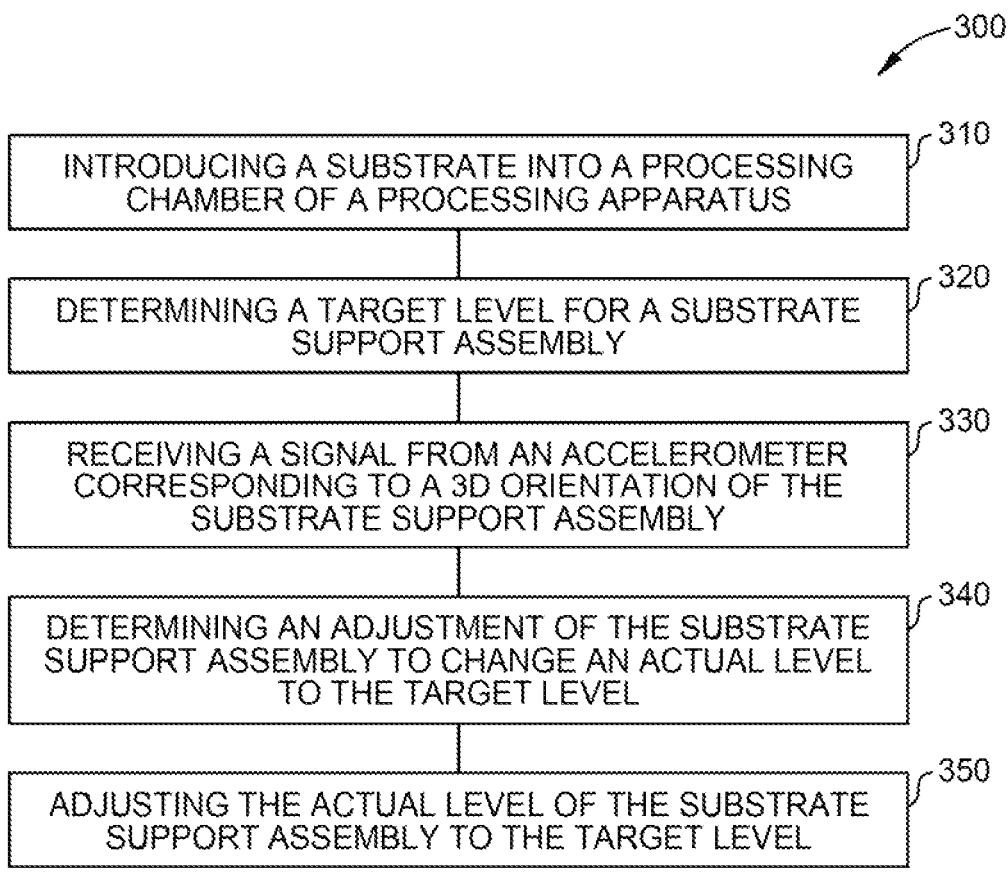
FIG. 3 is a diagram of a method for processing a substrate with a processing apparatus of the present disclosure, according to at least one embodiment.

FIG. 3 is a diagram of a method 300 for processing a substrate with a processing apparatus of the present disclosure. Instructions for the method 300 may be stored on a computer readable medium of the control module 160 or the system controller 199. The method 300 includes introducing 310 a substrate into the processing chamber 30 of the processing apparatus 100. For example, the substrate is introduced through the slit valve opening 105 in the wall 104 and disposed on the second side 132 of the support body 130 (shown in FIG. 1A). The method 300 further includes determining 320 a target level for the substrate support assembly 120. It is contemplated that the target level for the substrate to be processed may be pre-determined based on results from a preceding process. For example, the target level for the substrate support assembly 120 may be a desired tilt of the support body 130 measured as a degree of parallelism between the substrate-receiving surface 132 of the support body 130 in relation to the gas distribution plate 180 (shown in FIG. 1A). Although the degree of parallelism desired depends on the processing application, it is contemplated that tilt of the support body 130 may be accurately controlled within about five thousandths of an inch or less, such as about 3 thousandths of an inch or less, such as about one thousandth of an inch or less. It is contemplated that the tilt of the support body 130 may be such that the substrate-receiving surface 132 of the support body 130 is substantially parallel to the gas distribution plate 180. Alternatively or additionally, a predetermined tilt of the support body 130 may be such that a top surface of the support body 130 (and thus, a substrate positioned thereon) is substantially parallel to a lower surface of the gas distribution plate 180. As used herein the term "substantially parallel" may refer to surfaces which are oriented within about ten thousandths of an inch from parallel. In general, it is contemplated that the desired tilt of the support body 130 is such that the process is uniformly applied across the surface of the substrate.

The method 300 further includes receiving 330 a signal from the accelerometer 170 corresponding to the three-dimensional orientation of the substrate support assembly 120. For example, signals from the accelerometer 170 may include continuous analog or digital voltage readings corresponding to an orientation of the accelerometer 170 along each of the three axes. Based on calibration of the accelerometer 170 orientation in relation to the level of the substrate support assembly 120 with respect to the gas distribution plate 180, signals from the accelerometer 170 may provide an indication that the actual level of the substrate support assembly 120 is different from the target level. The method 300 further includes determining 340 an adjustment of the substrate support assembly 120 to change the actual level to the target level. Based on signals from the accelerometer 170 indicating the three-dimensional orientation of the substrate support assembly 120, the control module 160 is configured to determine the adjustment based on the difference between the actual level and the target level. The adjustment of the substrate support assembly 120 is determined in combination with knowledge of the tilt of the substrate support assembly 120 in relation to the rotational position of the plurality of leveling screws 114 based on calibration data. The method 300 further includes adjusting 350 the actual level of the substrate support assembly 120 to the target level. The level of the substrate support assembly 120 is adjusted using the plurality of actuators 150 as described above. It is contemplated that determining 320 the target level, receiving 330 the signal, determining 340 the adjustment, and adjusting 350 the actual level may be implemented via the control module 160. It is contemplated that the method 300 may be implemented autonomously using preset instructions.

Figure 4:
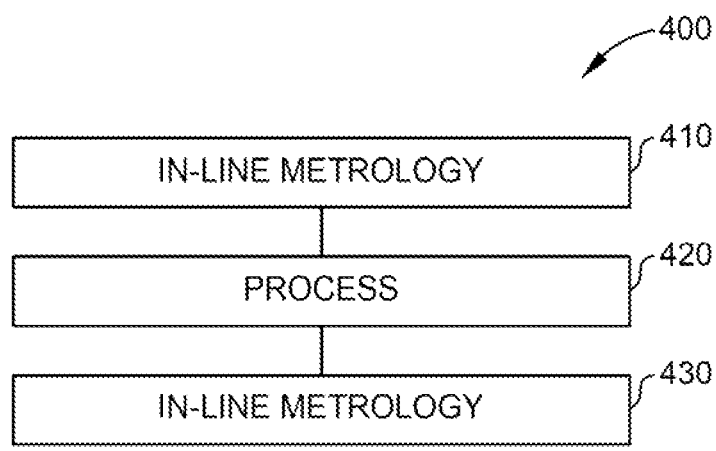
FIG. 4 is a diagram of a method for processing a substrate with a processing apparatus of the present disclosure, according to at least one embodiment.

FIG. 4 is a diagram of a method 400 for processing a substrate with a processing apparatus of the present disclosure. The method 400 illustrates an exemplary implementation of both feed-forward and feed-back control. However, it is contemplated that only feed-forward or only feed-back control may be used. Referring to FIG. 4, the method 400 includes in-line metrology operation 410, process 420, and in-line metrology operation 430. It is contemplated that the method 400 for processing the substrate may include one or more additional processes before or after the process 420. It is contemplated that the processes may include any suitable semiconductor substrate fabrication process, including without limitation deposition, etching, thermal treatment, cleaning, or polishing. It is contemplated that the process 420 may use apparatus and/or methods disclosed herein.

In-line metrology operations 410, 430 before and after the process 420 provide a quantitative measurement of one or more properties of the substrate. For example, a result on the substrate from a preceding process based on properties such as thickness, resistivity, dielectric constant, and/or refractive index, may be determined. During feed-forward control, control of the process 420 is based at least in part on measurements from in-line metrology operation 410. It is contemplated that feed-forward control may utilize measurements from any metrology operation preceding the process 420.

Oftentimes, batches of about 5 to about 25 substrates are processed together. Due to lot to lot variation, incoming batches sometimes have different characteristics which can be quantified during in-line metrology operation 410. Likewise, variation between substrates in the same batch (often referred to as wafer to wafer or within wafer variation) can be quantified during in-line metrology operation 410. For example, in-line metrology operations 410, 430 measure differences in thickness (e.g., using an eddy current sensor or optical measurement), undulations in material layers, defects, and other causes of non-uniformity. During feed-forward control, measurements from in-line metrology operation 410 are input to the process 420 to control the level of the substrate support assembly 120 to compensate for non-uniformity on the incoming substrate. For example, it is contemplated that measurements from in-line metrology operation 410 may be used in determining a target level for the substrate support assembly 120 as described with respect to the method 300. In one particular example, in-line metrology operation 410 measures a thickness of the substrate resulting from a preceding process. It is contemplated that the thickness may depend on the thickness of material deposited, the thickness of material removed, and/or the thickness of a bottom-side of the substrate. Therefore, differences in thickness between batches or between substrates can be accommodated in the process 420 by controlling the level of the substrate support assembly 120 as described above.

During feed-back control, control of the process 420 is based at least in part on measurements from in-line metrology operation 430. It is contemplated that feed-back control may utilize measurements from any metrology operation following the process 420. For example, in-line metrology operation 430 measures properties of the substrate resulting from the process 420. During feed-back control, measurements from in-line metrology operation 430 are input to the process 420 for fine-tuning the level of the substrate support assembly 120. For example, it is contemplated that measurements from in-line metrology operation 430 may be used in determining a target level for the substrate support assembly 120 and/or determining an adjustment of the substrate support assembly 120 to change the actual level to the target level as described with respect to the method 300.

It is contemplated that during both feed-forward and feed-back control the level of the substrate support assembly 120 may be adjusted so that a top surface of the support body 130 (and thus, a substrate positioned thereon) is substantially parallel to a lower surface of the gas distribution plate 180. Alternatively or additionally, it is contemplated that during both feed-forward and feed-back control the level of the substrate support assembly 120 may be adjusted to correct for non-uniformity of the substrate shape and/or topography.

It is contemplated that the apparatus and/or methods disclosed herein may be tuned using a flat or blanket substrate without patterns or a test substrate with test structures. For example, tuning may be performed before a new processing apparatus is brought online or returned to production following maintenance. Although described with respect to substrate processing, it is also contemplated that the apparatus and/or methods disclosed herein may be used to assist in setting a processing apparatus to certain baseline conditions.

As used herein, the terms "inner" and "outer"; "up" and "down"; "upper" and "lower"; "top" and "bottom", "vertical" and "horizontal", "upward" and "downward"; "above" and "below"; and other like terms as used herein refer to relative positions to one another and are not intended to denote a particular direction or spatial orientation of the overall source/apparatus. Unless specified otherwise, the terms "couple" and "coupled with" refer to "direct coupling with" or "coupled with via one or more intermediate elements or members."

While the foregoing is directed to embodiments of the present disclosure, other and further embodiments of the disclosure may be devised without departing from the basic scope thereof.

What is claimed is:

1. A substrate processing apparatus comprising:
a chamber body;
a substrate support assembly comprising a stem and a support body, the support body positioned within the chamber body and coupled to the stem;
a bracket assembly disposed outside the chamber body and coupled to the stem, the bracket assembly having a plurality of leveling screws for adjusting a level of the substrate support assembly;
an actuator coupled to one of the plurality of leveling screws, the actuator comprising driver electronics:
an accelerometer coupled to the substrate support assembly and disposed inside the stem of the substrate support assembly, wherein the accelerometer is configured to indicate an orientation of the substrate support assembly; and
a control module in communication with the actuator and the accelerometer, wherein the control module comprises automatic process control software and a control algorithm and is configured to:
automatically adjust the level of the substrate support assembly to a target level using the actuator when the chamber body is closed during processing by:
receiving, by the control algorithm, automated control instructions from the automatic process control software and signals from the accelerometer,
determining, by the control algorithm, the level of the substrate support assembly based on at least one of the orientation indicated by the signals from the accelerometer or automated control instructions from the automatic process control software, and
sending, by the control algorithm, instructions to the driver electronics to drive the actuator to move the substrate assembly to the target level.

2. The substrate processing apparatus of claim 1, wherein the actuator is a stepper motor.

3. The substrate processing apparatus of claim 1, wherein the actuator is a first actuator of a plurality of actuators, and wherein each of the plurality of leveling screws is independently adjusted by one of the plurality of actuators.

4. The substrate processing apparatus of claim 1, wherein the level of the substrate support assembly is determined in relation to a gas distribution plate disposed within the chamber body.

5. The substrate processing apparatus of claim 4, wherein adjusting the level of the substrate support assembly comprises aligning an upper surface of the support body substantially parallel to a lower surface of the gas distribution plate.

6. The substrate processing apparatus of claim 1, wherein the bracket assembly comprises a bracket in the shape of at least one of a triangle, square, rectangle or trapezoid when viewed from above, and wherein the plurality of leveling screws are adjustable with respect to the bracket.

7. The substrate processing apparatus of claim 1, wherein the accelerometer is a capacitive three-axis accelerometer.

8. The substrate processing apparatus of claim 7, wherein the accelerometer outputs a voltage corresponding to an orientation of the accelerometer along each of the three axes.

9. A substrate processing method for processing a substrate disposed on a substrate support assembly comprising a stem, a bracket assembly, and a support body, the support body positioned within a chamber body and coupled to the stem, the stem comprising an accelerometer, the stem coupled to the bracket assembly disposed outside the chamber body, the bracket assembly comprising an acutator, the method comprising:
receiving, by a control algorithm, automated control instructions from automatic process control software and a signal from the accelerometer coupled to the substrate support assembly, wherein the signal corresponds to a three-dimensional orientation of the substrate support assembly;
determining, by the control algorithm, the level of the substrate support assembly based on the signal from the accelerometer, and determine an adjustment of the substrate support assembly to change an actual level of the substrate support assembly to a target level; and adjusting the actual level of the substrate support assembly to the target level by turning, using the actuator comprising driver electronics, one or more of a plurality of leveling screws of the bracket assembly, wherein receiving the signal, determining the adjustment, and adjusting the actual level are implemented via a control module in communication with the actuator and the accelerometer, the control module comprising the control algorithm and automatic process control software, and wherein the control algorithm sends instructions to the driver electronics to drive the actuator to move the substrate assembly to the target level.

10. The substrate processing system of claim 9, wherein the actual level of the substrate support assembly is adjusted when the chamber body is closed during processing.

11. The substrate processing system of claim 9, wherein the actuator is a first actuator of a plurality of actuators, and wherein turning a first one of the plurality of leveling screws using the first actuator adjusts the actual level of the substrate support assembly about a first axis, the substrate processing method further comprising turning a second one of the plurality of leveling screws using a second actuator of the plurality of actuators to adjust the actual level of the substrate support assembly about a second axis oriented at a different angle from the first axis.

12. The substrate processing apparatus of claim 9, wherein the actual level of the substrate support assembly is determined in relation to a gas distribution plate disposed within the chamber body, and wherein adjusting the actual level of the substrate support assembly to the target level comprises aligning an upper surface of the support body substantially parallel to a lower surface of the gas distribution plate.

13. The substrate processing apparatus of claim 9, further comprising determining the target level for the substrate support assembly based on results from a preceding process.

* * * * *